United States Patent [19]
Dell'ova et al.

[11] Patent Number: 5,870,044
[45] Date of Patent: Feb. 9, 1999

[54] DIGITAL ANALOG CONVERTER WITH SELF-CALIBRATION CURRENT SOURCES

[75] Inventors: Francis Dell'ova, Seyssinet; Nathalie Dubois, Biviers; Olivier Scouarnec, Blama, all of France

[73] Assignee: SGS-Thomson Microelectronics S.A., Saint Genis, France

[21] Appl. No.: 966,755

[22] Filed: Nov. 10, 1997

[30] Foreign Application Priority Data

Nov. 14, 1996 [FR] France ................................. 96 14046

[51] Int. Cl.$^6$ ..................................................... H03M 1/10

[52] U.S. Cl. ............................................. 341/120; 341/144

[58] Field of Search ................................... 341/118, 120, 341/144

[56] References Cited

U.S. PATENT DOCUMENTS

| | | | |
|---|---|---|---|
| 4,647,907 | 3/1987 | Storey | 340/347 AD |
| 4,967,197 | 10/1990 | Peng | 341/118 |
| 5,446,455 | 8/1995 | Brooks | 341/145 |
| 5,646,619 | 7/1997 | Daubert et al. | 341/118 |
| 5,666,118 | 9/1997 | Gersbach | 341/120 |
| 5,703,586 | 12/1997 | Tucholski | 341/144 |

*Primary Examiner*—Brian Young
*Attorney, Agent, or Firm*—Wolf, Greenfield & Sacks, P.C.

[57] ABSTRACT

An digital-analog converter uses at least $2^N-1$ identical current sources capable of being calibrated to convert a number encoded on N bits and an additional current source designed to replace one of the $2^N-1$ current sources during the calibration of one of said sources. The additional current source is connected to the output by means of a sole additional commutator.

28 Claims, 2 Drawing Sheets

FIG_1 (PRIOR ART)
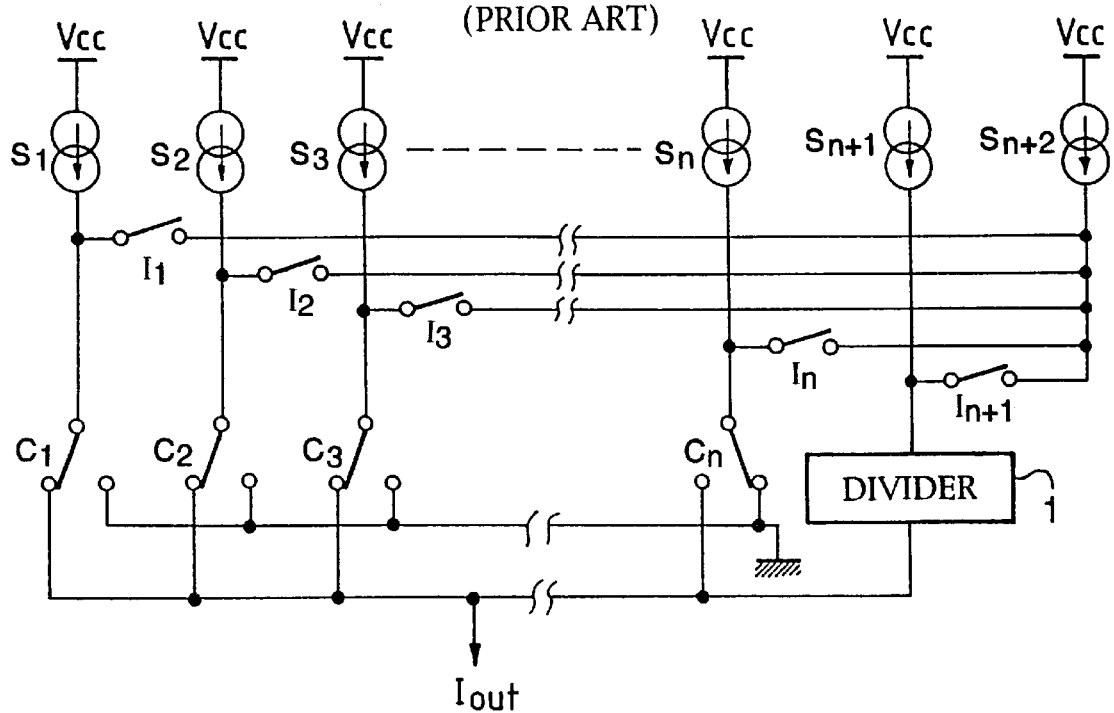
FIG_2
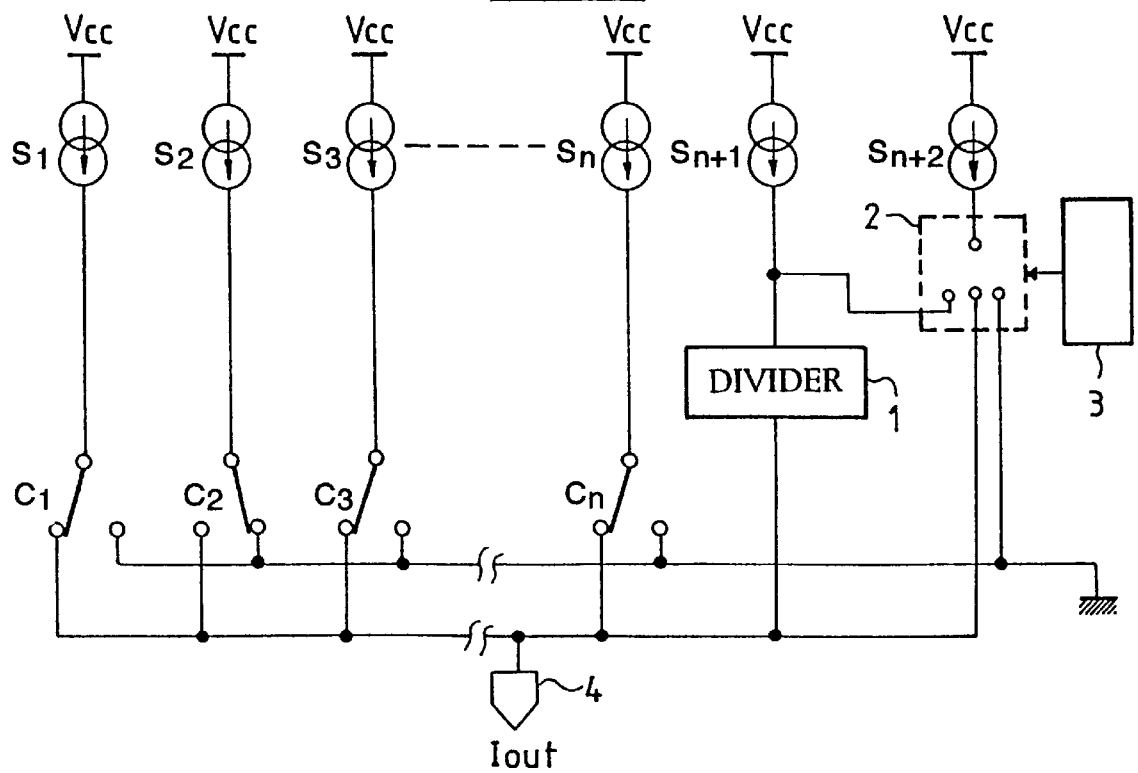

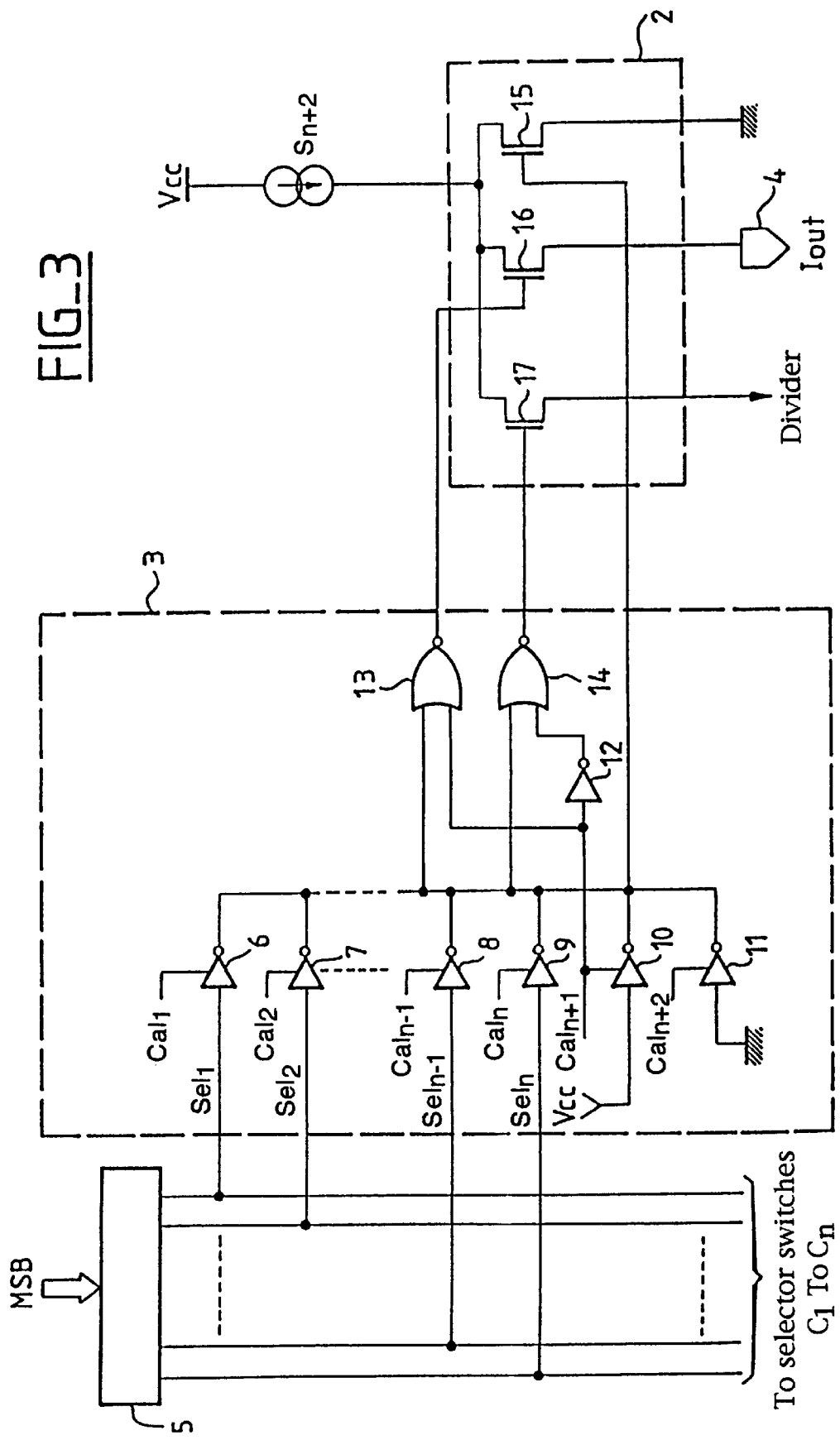
FIG_3

DIGITAL ANALOG CONVERTER WITH SELF-CALIBRATION CURRENT SOURCES

BACKGROUND OF THE INVENTION

1. Field of the Invention

The invention relates to a digital-analog converter with self-calibration current sources. These converters are commonly used in integrated circuits made by CMOS technology but may also be used in other types of technologies.

Digital-analog converters can be made in several ways. For reasons of technology and precision, there are converters using parallel-connected current sources whose output is directed either towards an output of the converter or towards a reference terminal.

The current sources are generally formed by a multiple current mirror whose output transistors are either all identical or proportional by powers of two. When it is sought to have very precise converters, i.e. when it is sought to convert more than 10 bits, then it is necessary to calibrate the sources constantly. Furthermore, combined systems are often used in which a first technique is used for the most significant bits and a second technique is used for the least significant bits.

2. Description of the Related Art

For a clearer understanding of the problem solved by the present invention, reference may be made to FIG. 1. FIG. 1 shows n identical sources $S_1$ to $S_n$ where $n=2^N-1$. These n sources are connected to commutators $C_1$ to $C_n$ that connect the output of each source either to the output of the converter to give a current Iout or to a reference voltage, for example the ground. The different connections set up by the commutators $C_1$ to $C_n$ are controlled by a thermometrical type decoder that validates the number of sources, among the sources $S_1$ to $S_n$, that are to be connected to the output of the converter as a function of the number present at the input of the converter, encoded on N bits that have to be converted.

For combined systems, there is added, for example, a source $S_{n+1}$ to which there is connected a current divider 1 that is slightly less precise but far more compact than the device described here above. The current divider 1 is generally used to convert the M least significant bits and the n sources $S_1$ to $S_n$ are used to convert the N most significant bits present at the input of the converter.

If fixed sources are used, the precision of the sources is related to the dimensions of the transistors used and is limited to approximately one per thousand. If it is sought to make conversions of numbers with more than 10 bits, it is necessary to use sources that are calibrated during the working of the converter. The sources used may for example be those described in the article by D. Wouter and J. Groeneveld, "A Self-Calibration Technique for Monolithic High-solution resolution D/A Converter", in IEEE Journal of Solid State Circuits, Vol. 24, No. 6, 6th Dec. 1989. So as not to interrupt the operation of the digital-analog converter, an additional source $S_{n+2}$ is added to replace each of the sources $S_1$ to $S_{n+1}$ when one of them gets calibrated. The additional source $S_{n+2}$ is connected to the output of each of the sources $S_1$ to $S_{n+1}$ by means of the switches $I_1$ to $I_{n+1}$.

The operation of the device of FIG. 1 is relatively simple. A shift register, associated with the converter or common to several converters present in one and the same chip, selects one source among the sources $S_1$ to $S_{n+2}$. A branch on the calibration command of the sources $S_1$ to $S_{n+1}$ is connected to the switches $I_1$ to $I_{n+1}$ in such a way that when one of the sources $S_1$ to $S_{n+1}$ gets calibrated, it is automatically replaced by the source $S_{n+2}$.

As described here above, problems appear. A first problem arises out of the switch-over noise at the output of the converter which is generated by automatic action on at least one of the switches $I_1$ to $I_n$, a second problem comes from the cumbersome nature of the wiring of the n switches $I_1$ to $I_n$ and of the control wires associated with these switches. A third problem is that, whatever the calibrated source, there is at least one commutation on one of the switches $I_1$ to $I_{n+1}$ which tends to produce current variations on the additional source $S_{n+2}$.

The invention proposes to overcome the three problems raised here above by using a commutator that will directly connect the additional source of the output.

SUMMARY OF THE INVENTION

An object of the invention is an analog-digital converter comprising N digital inputs each receiving a binary signal, the totality of the inputs representing a whole number ranging from 0 to $2^N-1$; an analog output; $2^N-1$ identical current sources capable of being calibrated, each of the current sources being connected to the analog output by means of a commutator associated with each source in such a way that there is a number of current sources connected to the analog output that is equal to the whole number present at the N inputs; an additional current source designed to replace one of the $2^N-1$ current sources during the calibration of one of said sources; and a selection circuit that selects one of said sources in order to calibrate it.

The additional current source is connected to the output by means of a sole additional commutator.

Preferably, the commutator is controlled by a logic circuit that activates the connection between the additional source and the analog output only if the source that is undergoing calibration has to be connected to the analog output.

One variant makes use of a combined system using a current divider for the least significant bits. Preferably, the commutator has three positions, and comprises three transistors.

BRIEF DESCRIPTION OF THE DRAWINGS

The invention will be understood more clearly and other advantages shall appear from the following description of a non-restrictive preferred embodiment, the description making reference to the appended drawings, of which:

FIG. 1 shows a converter according to the prior art;

FIG. 2 shows a preferred embodiment of the invention, and

FIG. 3 shows the detailed view of the commutator used and its control circuit.

DETAILED DESCRIPTION

FIG. 2 shows an analog-digital converter comprising N+M digital inputs representing a whole number ranging from 0 to $2^{N+M}-1$. The converter includes n current sources $S_1$ to $S_n$ that can be calibrated, n being equal to $2^N+1$, these n current sources being designed to convert N most significant bits.

The converter further includes n commutators $C_1$ to $C_n$ each having one input and two outputs, the commutators $C_1$ to $C_n$ enabling the connection of one of the outputs to the input as a function of a command coming from a thermometrical type decoder that is not shown.

The converter also includes a least significant current source $S_{n+1}$ that can be calibrated, designed to supply a reference current equal to the current of said current sources that can be calibrated $S_1$ to $S_n$; a current divider 1 having one current input and one current output, the current given at output being equal to the number represented by the M least significant bits multiplied by the reference current and divided by $2^M$; an additional current source $S_{n+2}$ identical to the other current sources $S_1$ to $S_{n+1}$, designed to replace the other sources during their calibration; and an additional commutator 2 having one input and first, second, and third current inputs and one control input, the additional commutator 2 enabling the connection of the current input to one of the current outputs as a function of the command coming from the control input.

The converter further includes a logic circuit 3 having one control output, said logic circuit 3 giving a command signal set up as a function of the sources to be activated and the sources to be calibrated; and an analog output terminal 4 that gives a current proportional to the number represented in the N+M digital inputs by summation of the currents coming from the different sources, where the output current can be used either directly or by means of a current-voltage converter made by means of any load.

Each of the current sources $S_1$ to $S_n$ that can be calibrated is connected first to a first reference voltage, for example VCC, and second to the current input of one of the n commutators $C_1$ to $C_n$ that is associated with it. One of the current sources of each of the n commutators $C_1$ to $C_n$ is connected to a second reference voltage, for example the ground, and the other output is connected to the analog output terminal 4.

The least significant current source $S_{n+2}$ is connected first to the first reference voltage and second to the input of the current divider 1. The output of the current divider 1 is connected to the analog output terminal 4.

The additional current source $S_{n+2}$ is connected first to the first reference voltage and second to the current input of the additional commutator 2. The control output of the logic circuit 3 is connected to the control input of the additional commutator 2. The first current output of the additional commutator 2 is connected to the second reference voltage. The second current output of the additional commutator 2 is connected to the analog output terminal 4. The third output of the additional commutator 2 is connected to the current input of the current divider 1.

In the foregoing preferred embodiment, a combined system is shown. Indeed, if only n sources are used, the surface area of the converter is doubled at each addition of a bit. In order to reduce this surface area, a divider is used. Conventionally, there may be N=9 and M=5. In general, the taking of excessively large values of M will be avoided for the divider is less precise than the use of a plurality of sources. The precision with respect to the plurality of sources must however be smaller than the total resolution of the converter.

Alternatively, if it is desired to have a converter that uses only the plurality of sources, it is enough to eliminate the least significant source $S_{n+1}$, the current divider 1, and replace the additional commutator 2 by a two-output commutator.

The converter works as follows. The first step is the decoding of the N most significant bits in the thermometrical decoder (which is not shown) and the selection of the commands to be sent to each of the n commutators $C_1$ to $C_n$ in order to have as many current sources $S_1$ to $S_n$ that can be calibrated connected to the output as the number represented by the most significant bits N, at the same time, decoding the M least significant bits in the current divider 1 and the production of a current proportional to a fraction of the reference current and to the number represented by the M least significant bits, at the same time, the selection of a source to be calibrated from among all the current sources $S_1$ to $S_{n+2}$ and the calibration of this source, and the preparation and dispatch to the additional commutator 2 of a command by means of the logic circuit 3 as a function of the commands sent to the commutators $C_1$ to $C_n$ and of the source to be calibrated.

For the command sent to the additional commutator 2, three cases are possible.

Case 1: The command of one of the commutators $C_1$ to $C_n$ positions the commutator on the output terminal 4 while the source associated with the commutator must be calibrated; a command is sent to the additional commutator 2 so that the current input is connected to the second current output.

Case 2: The source that has to be calibrated is the least significant current source $S_{n+1}$; a command is sent to the additional commutator 2 so that the current input is connected to the third current output.

Case 3: Neither the case 1 nor the case 2 applies; the command is sent to the additional commutator 2 so that the current input is connected to the first current output.

If no current divider 1 is used, the case 2 does not exist. Furthermore, the case 3 becomes complementary to the case 1. It is possible to have only one of these cases.

FIG. 3 gives a schematic view of a preferred embodiment of the additional commutator 2 and of the logic circuit 3 which enables a clearer understanding of the operation described here above.

A thermometrical decoder 5 receives N most significant bits MSB and gives n selection signals $Sel_1$ to $Sel_n$ at n independent outputs. Each of the selection signals $Sel_1$ to $Sel_n$ respectively controls one of the n commutators $C_1$ to $C_n$.

The logic circuit 3 comprises n+2 three-state output NOT gates 6 to 11, each having one signal input, one control input and one output, an inverter 12 having one input and one output, first and second NOR gates 13 and 14 each having two inputs and one output, n selection inputs receiving the selection signals $Sel_1$ to $Sel_n$, n+2 calibration inputs receiving calibration signals $Cal_1$ to $Cal_{n+2}$ coming from a device that selects the source to be calibrated, a logic output indicating that the additional source $S_{n+2}$ must be connected to the output terminal 4, a divider control output indicating that the additional source $S_{n+2}$ must be connected to the input of the current divider 1, and a disconnection output indicating that the additional source $S_{n+2}$ must be connected to the second reference voltage.

The signal inputs of n three-output NOT gates 6 to 9 are respectively connected to the selection inputs receiving the selection signals $Sel_1$ to $Sel_n$. The control inputs of the n+2 said gates 6 to 11 are respectively connected to the calibration inputs $Cal_1$ to $Cal_{n+2}$. The signal input of the nth NOT gate 10 is connected to an active logic level, for example, VCC. The signal input of the n+2nd NOT gate 11 is connected to an inactive logic level, for example, the ground. The outputs of the n+2 three-state output NOT gates are connected together to the connection output and to the first inputs of the first and second NOR gates 13 and 14. The second input of the first NOR gate 13 receives the calibration signal $Cal_{n+1}$ which corresponds to the calibration of the least significant current source $S_{n+1}$. The output of the first NOR gate is connected to the logic output. The input of the inverter 12 receives the calibration signal $Cal_{n+1}$ which corresponds to the calibration of the least significant current source $S_{n+1}$. The output of the inverter 12 is connected to the second input of the second NOR gate 14. The output of the second NOR gate is connected to the divider control output.

The additional commutator 2 has first, second and third transistors 15 to 17. The drains of the first, second and third transistors 15 to 17 are connected together to the current input of the additional commutator 2 connected to the additional source $S_{n+2}$. The source of the first transistor 15 is connected to the second voltage reference through the first current output of the additional commutator 2. The gate of the first transistor 15 is connected to the disconnection output of the logic circuit 3. The source of the second transistor 16 is connected to the analog output terminal 4 through the second output of the additional commutator 2. The gate of the second transistor 16 is connected to the logic output of the logic circuit 3. The source of the third transistor 17 is connected to the input of the current divider 1 through the third current output of the additional commutator 2. The gate of the third transistor 17 is connected to the divider control output of the logic circuit 3. The gates of the first, second and third transistors form the control input of the additional commutator 2.

Only one of the calibration signals $Cal_1$ to $Cal_{n+2}$ is active at a time. This makes only one of the three-state output NOT gates 6 to 11 active. If the active calibration signal corresponds to one of the current sources $S_1$ to $S_n$ that can be calibrated, then only the selection signal associated with said source that is having itself calibrated is taken into account. If the selection signal taken into account is inactive, then the disconnection output is active, the logic output is inactive and the divider control output is inactive. If the selection signal taken into account is active, then the logic output is active, the divider control output is inactive and the disconnection output is inactive. If the calibration signal corresponds to the least significant current source $S_{n+1}$, then the divider control output is active, the logic output is inactive and the disconnection output is inactive. If the calibration signal corresponds to the additional current source $S_{n+2}$ then the disconnection output is active, the logic output is inactive and the divider control output is inactive. The three cases referred to here above are therefore fulfilled.

Those skilled in the art might believe that the commutation operations that occur in the logic circuit 3 could create parasitic commutations at the additional commutator 2. Indeed, the transistors forming the logic circuit are reduced to the minimum size permitted by the technology used in order commutate as fast as possible while the transistors 15 to 17 of the additional commutator 2 are sized to let through the current coming from the additional current source $S_{n+2}$ in creating the smallest possible number of disturbances. The differences in the size of the transistors mean that the commutation time of the transistors 15 to 17 of the additional commutator 2 are far greater than the commutation times of the logic circuit 3, thus achieving a "filtering" of the parasitic commutations at the level of the transistors 15 to 17 of the additional commutator. Furthermore, the difference in size of the transistors of the logic circuit 3 with respect to the transistors used to commutate the current sources means that the logic circuit uses far less space on a chip than the plurality of the commutation transistors used in the prior art, although the logic circuit uses about four times more transistors.

As those skilled in the art will have certainly understood, many variants are possible to make the logic circuit. Each of the three-state output NOT gates 6 to 11 fulfills an AND type function and the connection of the outputs of said three-state output NOT gates 6 to 11 fulfills a wired OR type function. There are many possibilities to obtain these functions. However, the use of a wired OR function means saving on a large number of transistors.

Should no current divider be used, it is preferable to modify the logic circuit 3. Indeed, the three-state output NOT gates 10 and 11 associated with the least significant current sources Sn+1 and the additional source $S_{n+2}$ may be eliminated as well as the NOR gates 13 and 14, and the inverter 12. Only the disconnection output may remain or may become the logic output if an inverter is added or if these NOT gates 6 to 9 are replaced by non-inverter transfer gates. It is possible to add an inverter to the additional commutator 2 between the gates of the first and second transistors if it is desired to have only one output on the logic circuit 3. The third transistor 17 may also be eliminated.

Variants using dual circuits may be used without changing the object of the invention. Thus, the first and second reference voltages may be inverted or even replaced by other reference voltages. The active and inactive levels may also well correspond to high and low levels depending on whether the transistors of the commutator are N type or P type transistors. Current inputs and outputs may be inverted as a function of the direction of the current. Many other equivalent embodiments may also enable the invention to be obtained without necessarily implementing precisely the diagrams of FIGS. 2 and 3 which correspond to a preferred, non-restrictive embodiment of the invention.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only, and it is not intended as limiting. The invention's limit is defined only in the following claims and the equivalent thereto.

What is claimed is:

1. An digital to analog converter comprising:

N digital inputs each receiving a binary signal, the inputs representing a whole number ranging from 0 to $2^N-1$;

an analog output;

$2^N-1$ identical current sources capable of being calibrated, each of the current sources being connected to the analog output by means of a commutator associated with each current source in such a way that there is a number of current sources connected to the analog output that is equal to the whole number present at the N inputs;

an additional current source designed to replace one of the $2^N-1$ current sources during the calibration of one of said sources; and a selection circuit that selects one of said identical current sources in order to calibrate it, wherein the additional current source is connected to the output by means of a sole additional commutator.

2. The converter according to claim 1, wherein the sole additional commutator is controlled by a logic circuit that activates the connection between the additional current source and the analog output only if the source that is undergoing calibration has to be connected to the output.

3. The converter according to claim 2, wherein the logic circuit comprises:

$2^N-1$ selection inputs, each selection input corresponding to and adapted to operate one of the $2^N-1$ current sources;

$2^N-1$ calibration inputs, each calibration input corresponding to the calibration of one of the $2^N-1$ current sources; and a logic output, wherein the logic output is active if one of the selection inputs is active when the calibration input associated with the same current source is active.

4. The converter according to claim 3, wherein the logic circuit comprises $2^N-1$ transfer gates corresponding to the $2^N-1$ current sources, each transfer gate having a bit input, an output enabling input, and an output, and wherein the bit input and the output enabling input of each of the transfer gates are connected respectively to the selection input and to the calibration input associated a same one of said current sources; and the outputs of all the transfer gates are connected together and connected to a disconnection output of the logic circuit.

5. The converter according to claim 1, further comprising:

M least significant digital inputs representing a least significant number;

a least significant current source capable of being calibrated; and a current divider connected to the least significant current source and connected to the analog output in order to give a current proportional to the least significant number, wherein the sole additional commutator enables the connection of the additional current source to the current divider when the least significant current source is calibrated.

6. The converter according to claim 2, further comprising:

M least significant digital inputs representing a least significant number;

a least significant current source capable of being calibrated; and a current divider connected to the least significant current source and connected to the analog output in order to give a current proportional to the least significant number, wherein the sole additional commutator enables the connection of the additional current source to the current divider when the least significant current source is calibrated.

7. The converter according to claim 3, further comprising:

M least significant digital inputs representing a least significant number;

a least significant current source capable of being calibrated; and a current divider connected to the least significant current source and connected to the analog output in order to give a current proportional to the least significant number, wherein the sole additional commutator enables the connection of the additional current source to the current divider when the least significant current source is calibrated.

8. The converter according to claim 4, further comprising:

M least significant digital inputs representing a least significant number;

a least significant current source capable of being calibrated; and a current divider connected to the least significant current source and connected to the analog output in order to give a current proportional to the least significant number, wherein the sole additional commutator enables the connection of the additional current source to the current divider when the least significant current source is calibrated.

9. The converter according to claim 3, wherein the logic circuit further comprises:

a least significant calibration input;

an additional calibration input;

a divider control output; and a disconnection output, wherein the divider control output is active if the least significant calibration input is active, and the disconnection output is active if the logic and divider control outputs are inactive.

10. The converter according to claim 4, wherein the logic circuit further comprises:

a least significant calibration input;

an additional calibration input;

a divider control output; and a disconnection output, wherein the divider control output is active if the least significant calibration input is active, and the disconnection output is active if the logic and divider control outputs are inactive.

11. The converter according to claim 5, wherein the logic circuit further comprises:

a least significant calibration input;

an additional calibration input;

a divider control output; and a disconnection output, wherein the divider control output is active if the least significant calibration input is active, and the disconnection output is active if the logic and divider control outputs are inactive.

12. The converter according to claim 9, wherein the sole additional commutator is a three-position commutator that comprises first, second, and third transistors whose drains are connected together to the additional source, the gate of the first transistor is connected to a reference voltage, the gate of the second transistor is connected to the logic output, the output of the second transistor is connected to the analog output, the gate of the third transistor is connected to the divider control output, and the source of the third transistor is connected to the least significant current source and to the current divider.

13. The converter according to claim 10, wherein the sole additional commutator is a three-position commutator that comprises first, second, and third transistors whose drains are connected together to the additional source, the gate of the first transistor is connected to a reference voltage, the gate of the second transistor is connected to the logic output, the output of the second transistor is connected to the analog output, the gate of the third transistor is connected to the divider control output, and the source of the third transistor is connected to the least significant current source and to the current divider.

14. The converter according to claim 11, wherein the sole additional commutator is a three-position commutator that comprises first, second, and third transistors whose drains are connected together to the additional source, the gate of the first transistor is connected to a reference voltage, the gate of the second transistor is connected to the logic output, the output of the second transistor is connected to the analog output, the gate of the third transistor is connected to the divider control output, and the source of the third transistor is connected to the least significant current source and to the current divider.

15. The converter according to claim 9, wherein the transfer gates are three-state output NOT gates and wherein the logic circuit further comprises:

first and second three-state NOT type additional gates, each having one bit input, one output enabling input, and one output;

first and second NOR gates having first and second inputs and one output, and an inverter gate having one input and one output, wherein the bit input of the first NOT type additional gate is for receiving an active level, the bit input of the second NOT type additional gate is for receiving an inactive level, the enabling input of the first NOT type additional gate is connected to the least significant calibration input, the enabling input of the second NOT type additional gate is connected to the additional calibration input, the outputs of the first and second NOT type additional gates are connected together to the outputs of the three-state output NOT gates, the outputs of the three-state output NOT gates are the same as the disconnection output, the first inputs of the first and second NOR type gates are connected to the outputs of the three-state output NOT gates, the second input of the first NOR gate is connected to the least significant calibration input, the output of the first NOR gate is the same as the logic output, the input of the inverter gate is connected to the least significant calibration input, and the second input of the second NOR gate is connected to the output of the inverter gate, the output of the second NOR gate is the divider control output.

16. The converter according to claim 10, wherein the transfer gates are three-state output NOT gates and wherein the logic circuit further comprises:

first and second three-state NOT type additional gates, each having one bit input, one output enabling input, and one output;

first and second NOR gates having first and second inputs and one output, and an inverter gate having one input and one output, wherein the bit input of the first NOT type additional gate is for receiving an active level, the bit input of the second NOT type additional gate is for receiving an inactive level, the enabling input of the first NOT type additional gate is connected to the least significant calibration input, the enabling input of the second NOT type additional gate is connected to the additional calibration input, the outputs of the first and second NOT type additional gates are connected together to the outputs of the three-state output NOT gates, the outputs of the three-state output NOT gates are the same as the disconnection output, the first inputs of the first and second NOR type gates are connected to the outputs of the three-state output NOT gates, the second input of the first NOR gate is connected to the least significant calibration input, the output of the first NOR gate is the same as the logic output, the input of the inverter gate is connected to the least significant calibration input, and the second input of the second NOR gate is connected to the output of the inverter gate, the output of the second NOR gate is the divider control output.

17. The converter according to claim 11, wherein the transfer gates are three-state output NOT gates and wherein the logic circuit further comprises:

first and second three-state NOT type additional gates, each having one bit input, one output enabling input, and one output;

first and second NOR gates having first and second inputs and one output, and an inverter gate having one input and one output, wherein the bit input of the first NOT type additional gate is for receiving an active level, the bit input of the second NOT type additional gate is for receiving an inactive level, the enabling input of the first NOT type additional gate is connected to the least significant calibration input, the enabling input of the second NOT type additional gate is connected to the additional calibration input, the outputs of the first and second NOT type additional gates are connected together to the outputs of the three-state output NOT gates, the outputs of the three-state output NOT gates are the same as the disconnection output, the first inputs of the first and second NOR type gates are connected to the outputs of the three-state output NOT gates, the second input of the first NOR gate is connected to the least significant calibration input, the output of the first NOR gate is the same as the logic output, the input of the inverter gate is connected to the least significant calibration input, and the second input of the second NOR gate is connected to the output of the inverter gate, the output of the second NOR gate is the divider control output.

18. The converter according to claim 12, wherein the transfer gates are three-state output NOT gates and wherein the logic circuit further comprises:

first and second three-state NOT type additional gates, each having one bit input, one output enabling input, and one output;

first and second NOR gates having first and second inputs and one output, and an inverter gate having one input and one output, wherein the bit input of the first NOT type additional gate is for receiving an active level, the bit input of the second NOT type additional gate is for receiving an inactive level, the enabling input of the first NOT type additional gate is connected to the least significant calibration input, the enabling input of the second NOT type additional gate is connected to the additional calibration input, the outputs of the first and second NOT type additional gates are connected together to the outputs of the three-state output NOT gates, the outputs of the three-state output NOT gates are the same as the disconnection output, the first inputs of the first and second NOR type gates are connected to the outputs of the three-state output NOT gates, the second input of the first NOR gate is connected to the least significant calibration input, the output of the first NOR gate is the same as the logic output, the input of the inverter gate is connected to the least significant calibration input, and the second input of the second NOR gate is connected to the output of the inverter gate, the output of the second NOR gate is the divider control output.

19. The converter according to claim 13, wherein the transfer gates are three-state output NOT gates and wherein the logic circuit further comprises:

first and second three-state NOT type additional gates, each having one bit input, one output enabling input, and one output;

first and second NOR gates having first and second inputs and one output, and an inverter gate having one input and one output, wherein the bit input of the first NOT type additional gate is for receiving an active level, the bit input of the second NOT type additional gate is for receiving an inactive level, the enabling input of the first NOT type additional gate is connected to the least significant calibration input, the enabling input of the second NOT type additional gate is connected to the additional calibration input, the outputs of the first and second NOT type additional gates are connected together to the outputs of the three-state output NOT gates, the outputs of the three-state output NOT gates are the same as the disconnection output, the first inputs of the first and second NOR type gates are connected to the outputs of the three-state output NOT gates, the second input of the first NOR gate is connected to the least significant calibration input, the output of the first NOR gate is the same as the logic output, the input of the inverter gate is connected to the least significant calibration input, and the second input of the second NOR gate is connected to the output of the inverter gate, the output of the second NOR gate is the divider control output.

20. The converter according to claim 14, wherein the transfer gates are three-state output NOT gates and wherein the logic circuit further comprises:

first and second three-state NOT type additional gates, each having one bit input, one output enabling input, and one output;

first and second NOR gates having first and second inputs and one output, and an inverter gate having one input and one output, wherein the bit input of the first NOT type additional gate is for receiving an active level, the bit input of the second NOT type additional gate is for receiving an inactive level, the enabling input of the first NOT type additional gate is connected to the least significant calibration input, the enabling input of the second NOT type additional gate is connected to the additional calibration input, the outputs of the first and second NOT type additional gates are connected together to the outputs of the three-state output NOT gates, the outputs of the three-state output NOT gates are the same as the disconnection output, the first inputs of the first and second NOR type gates are connected to the outputs of the three-state output NOT gates, the second input of the first NOR gate is connected to the least significant calibration input, the output of the first NOR gate is the same as the logic output, the input of the inverter gate is connected to the least significant calibration input, and the second input of the second NOR gate is connected to the output of the inverter gate, the output of the second NOR gate is the divider control output.

21. A digital to analog converter having a digital input and an analog output, comprising:

a plurality of substantially identical current sources;

a plurality of commutators respectively associated with said current sources, and coupled to the analog output;

an additional current source for replacing one of said current sources when one of said current sources is being calibrated;

a circuit for selecting one of said current sources for calibration; and a sole additional commutator for coupling the additional current source to the analog output.

22. The converter of claim 21, further comprising a logic circuit coupled to the sole additional commutator, the logic circuit controlling the operation of the additional commutator.

23. The converter of claim 21, wherein the logic circuit includes a decoder for decoding the N most significant bits of the digital input.

24. The converter of claim 23, wherein the sole additional commutator includes a plurality of transistors, wherein at least one of said transistors is coupled to the output of the logic circuit.

25. The converter of claim 21, further comprising a divider coupled to an output of the sole additional commutator.

26. The converter of claim 24, further comprising a divider coupled to an output of the sole additional commutator.

27. The converter of claim 26, wherein an output of another one of said plurality of transistors is coupled to the analog output.

28. The converter of claim 27, wherein the output of the at least one of said transistors is coupled to the divider.

* * * * *

UNITED STATES PATENT AND TRADEMARK OFFICE
CERTIFICATE OF CORRECTION

PATENT NO. : 5,870,044
DATED : February 9, 1999
INVENTOR(S) : Francis Dell'ova, Nathalie Dubois, and Olivier Scouarnec It is certified that error appears in the above-identified patent and that said Letters Patent is hereby corrected as shown below:

On the title page, Item 75 should read:

[75] Inventors: Francis Dell'ova, Seyssinet; Nathalie Dubois, Biviers; and Olivier Scouarnec, Balma, all of France In col. 2, line 16, replace
"an analog-digital" with --a digital-analog--;
In col. 2, line 55, replace
"an analog-digital" with --a digital-analog--.

Signed and Sealed this

Thirteenth Day of July, 1999

Attest:

Q. TODD DICKINSON

Attesting Officer

Acting Commissioner of Patents and Trademarks